United States Patent [19]
Culver

[11] Patent Number: 5,256,902
[45] Date of Patent: Oct. 26, 1993

[54] METAL HEATSINK ATTACH SYSTEM

[75] Inventor: Robbyn M. Culver, San Jose, Calif.

[73] Assignee: VLSI Technology, Inc., San Jose, Calif.

[21] Appl. No.: 744,862

[22] Filed: Aug. 14, 1991

[51] Int. Cl.$^5$ .................. H01L 23/02; H01L 39/02
[52] U.S. Cl. ................... 257/722; 257/733; 174/16.3; 165/80.3; 361/702
[58] Field of Search ................ 357/81, 80, 74; 257/722, 733; 361/383; 174/163; 165/80.3

[56] References Cited

U.S. PATENT DOCUMENTS

| | | | |
|---|---|---|---|
| 3,728,584 | 4/1973 | Kuhlow | 357/80 |
| 4,209,347 | 6/1980 | Klein | 357/81 |
| 4,340,902 | 7/1982 | Honda et al. | 357/74 |
| 4,345,267 | 8/1982 | Cerman et al. | 357/81 |
| 4,396,935 | 8/1983 | Schuck | 357/81 |
| 4,420,767 | 12/1983 | Hodge et al. | 357/81 |
| 4,652,971 | 3/1987 | Peterson et al. | 357/81 |
| 4,715,438 | 12/1987 | Gabuzda et al. | 357/81 |
| 4,750,031 | 6/1988 | Miller et al. | 357/81 |
| 4,757,934 | 7/1988 | Greenstein | 357/81 |

OTHER PUBLICATIONS

Microelectronics Packaging Handbook edited by Rao Tummala et al., Van Nostrand Reinhold Publishing Company, 1989, pp. 36–37, 48–51, 744 and 745.

Primary Examiner—Rolf Hille
Assistant Examiner—David Ostrowski
Attorney, Agent, or Firm—Patrick T. King

[57] ABSTRACT

A heat-sink cooling apparatus and a method for attaching a heatsink to a ceramic integrated-circuit package are provided. An externally-threaded molybdenum stud is attached to and extends from a copper/tungsten slug, or attachment plate, which is brazed to the ceramic integrated-circuit package. The stud and the slug have similar thermal coefficients of expansion to reduce thermal stress at the interface therebetween. An aluminum heatsink has an internally threaded hole formed therein for receiving the externally-threaded molybdenum stud. The external threads of the harder molybdenum material engage and deform the threads formed in the aluminum heatsink to provide strong mechanical and thermal bonding between the stud and the heatsink.

5 Claims, 2 Drawing Sheets

METAL HEATSINK ATTACH SYSTEM

BACKGROUND OF THE INVENTION

1. Field of the Invention

This invention relates to integrated circuit packages, and more particularly is concerned with apparatus for attaching an aluminum heatsink to a ceramic integrated-circuit package.

2. Prior Art

One technique for attaching an aluminum heatsink to a ceramic integrated-circuit package is to use a silver-filled epoxy material for bonding a surface of the heatsink to a surface of the ceramic package. The silver-filled epoxy is first applied to the attachment surface of the ceramic integrated-circuit package. Then, a surface of the heatsink is placed over the attachment surface of the package in contact with the silver-filled epoxy. The epoxy is then cured for a certain amount of time in a heated oven to form a bond between the heatsink and the ceramic package. This technique has several disadvantages. The thermal conductivity of the silver-filled epoxy material is not as good as a direct metal connection between the heatsink and the ceramic package. Additional handling and processing time is required for transferring and curing the silver-filled epoxy material in an oven. The epoxy bond is subject to failure during, for example, a steam pressure pot test.

Another technique for attaching an aluminum heatsink to a ceramic integrated-circuit package is to use a threaded copper stud, which is attached to the ceramic package. The aluminum heatsink has internal threads into which the copper stud is threaded. The copper is soft and is deformed by the harder internal threads of the aluminum heatsink so a loose mechanical bond is formed between the copper stud and the heatsink.

Consequently, the need exists for an improved technique for attaching an aluminum heatsink to a ceramic integrated-circuit package which will provide strong and reliable metallic mechanical and thermal connections between the heatsink and the ceramic package, without requiring additional handling and processing time, such as required for connections made with epoxy material.

SUMMARY OF THE INVENTION

It is therefore an object of this invention to provide an improved technique for attaching an aluminum heatsink to a ceramic integrated-circuit package, where the technique uses a metallic stud to provide strong and reliable mechanical and thermal connections between the heatsink and the ceramic package.

Another object of this invention is provide for a fast, simple assembly of the heatsink to the package.

In accordance with these and other objects of the invention, a heat-sink cooling system is provided for attaching a heatsink to a mounting surface of a ceramic integrated-circuit package. The system includes a copper/tungsten attachment plate having a surface adapted for attachment to the mounting surface of the ceramic integrated-circuit package. An externally-threaded molybdenum stud is attached to and extends from the copper/tungsten attachment plate. An aluminum heatsink has an internally threaded hole formed therein for receiving the threaded molybdenum stud. The external threads of the hard molybdenum material engage and deform the threads formed in the aluminum heatsink and provide strong mechanical and thermal bonding between the stud and the heatsink.

A method of attaching an aluminum heatsink to a ceramic integrated-circuit package is provided according to the invention. The method includes the step of bonding an externally-threaded molybdenum stud to one surface of a copper/tungsten attachment plate and bonding another surface of the copper/tungsten attachment plate to a mounting surface of the ceramic integrated-circuit package. The molybdenum stud and the aluminum heatsink are then mechanically and thermally bonded together by screwing the externally-threaded molybdenum stud into a correspondingly internally threaded hole formed in the aluminum heatsink.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
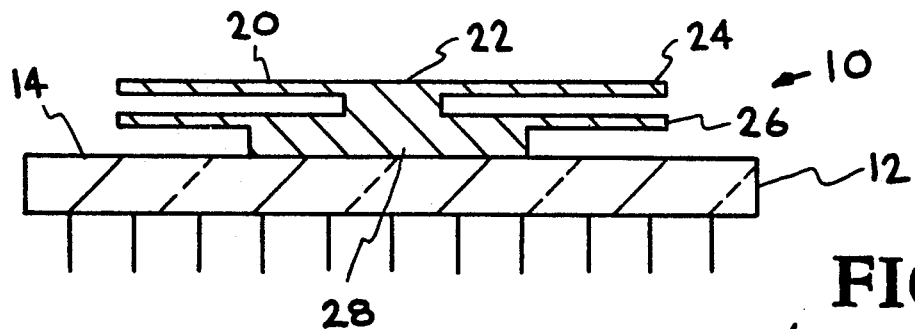
FIG. 1 is a partially sectional, elevation view of a prior art heatsink and integrated circuit package assembly.

FIG. 1 shows a prior art heatsink and integrated circuit package assembly 10, in which an aluminum heatsink is epoxy-bonded to a ceramic package. The ceramic integrated-circuit package 12 is, for example, a high performance pin grid array HPPGA package, which has a flat top surface 14 to provide a mounting surface for a heatsink 20. The cylindrical aluminum heatsink 20 is formed with a solid cylindrical core 22 from which radially extend thinner heat-radiating fins, including, for example, an upper fin 24 and a lower fin 26. The heatsink 20 includes a disk-shaped base portion 28, which has a flat lower surface, which is fixed to the top surface 14 of the ceramic package 12 using a conductive silver-filled epoxy material. The epoxy bond can fail during a pressure pot test or during temperature cycling.

Figure 2:
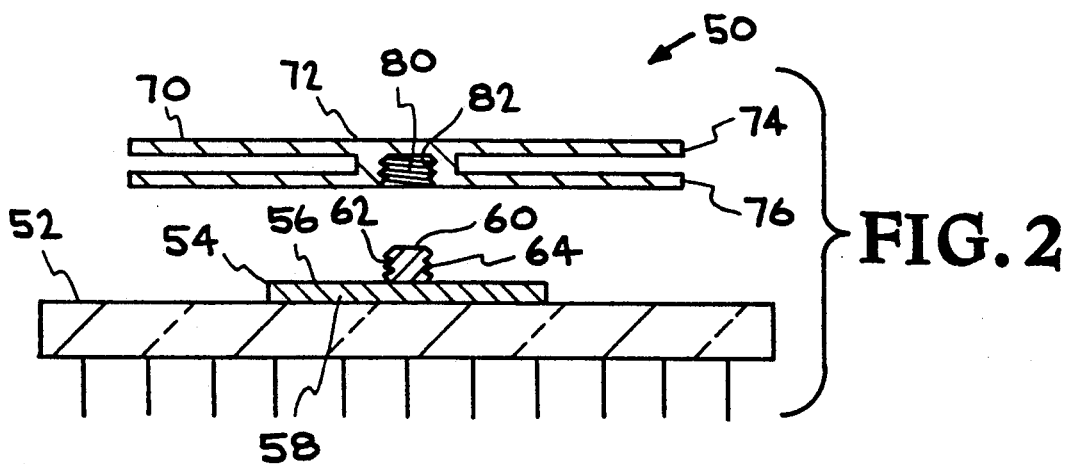
FIG. 2 is a partially sectional, exploded, elevation view of a heatsink and integrated circuit package assembly with a molybdenum stud fixed thereto according to the present invention.
Figure 3:
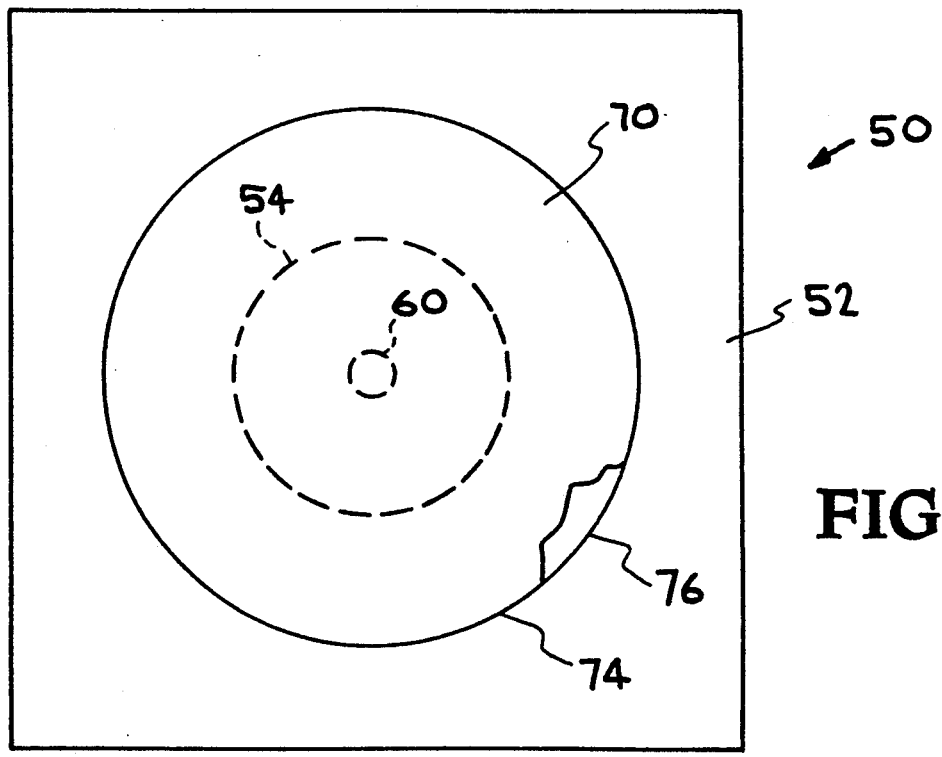
FIG. 3 is a plan view of the integrated circuit package of FIG. 2.

FIGS. 2 and 3 show plan and elevation views (partially sectional) of a heatsink and integrated circuit package assembly 50, according to the present invention. A ceramic integrated-circuit package 52, such as a HPPGA package, has a flat top surface to which is silver/copper brazed a slug, or attachment plate, 54. The slug is formed of copper/tungsten and is shaped as a disk having a flat top flat surface 56 and a flat bottom surface 58. The slug 54 has a diameter of 0.650 inches and a thickness of 0.050 inches.

A molybdenum cylindrical stud 60 having a height of 0.150 inches and a diameter of 0.125 inches is attached with a silver/copper braze to the center of the top surface 56 of the slug 54. The exterior cylindrical surface 62 of the molybdenum stud 60 has 10-32 threads 64 formed therein. For purposes of this application "molybdenum" is meant to mean molybdenum and molybdenum alloys. The invention is not limited to the specific exemplary dimensions specified for the various elements described herein.

In an alternative embodiment of the invention, the stud 60 and the slug 54 are integrally formed of molybdenum.

Figure 4:
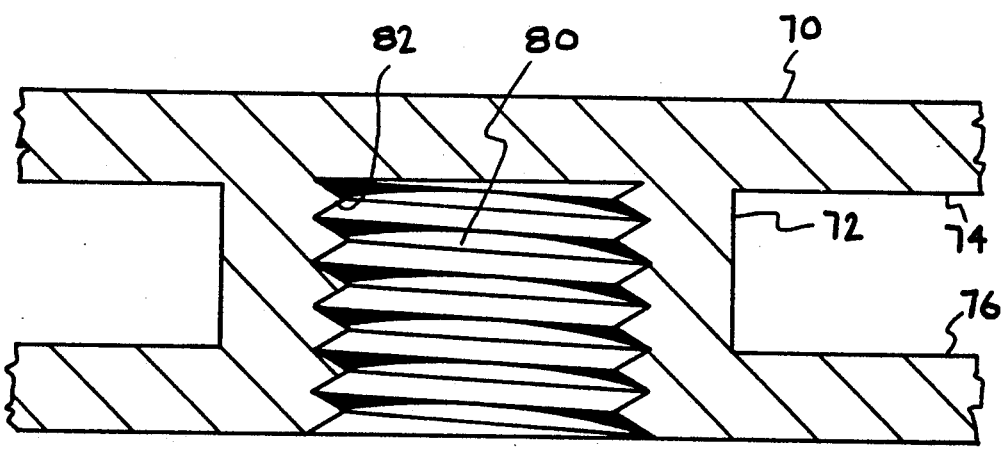
FIG. 4 is an enlarged sectional view of an aluminum heatsink showing internal threads formed within a central bore.

FIG. 4 shows an enlarged cross-sectional views of the threads 80 of a new and unused aluminum heatsink 70. The heatsink 70 is formed with a cylindrically-shaped core 72 from which radially extend thinner heat-radiating fins, including an upper fin 74 and a lower fin 76. The heatsink has a smooth, flat lower surface 78.

Figure 5:
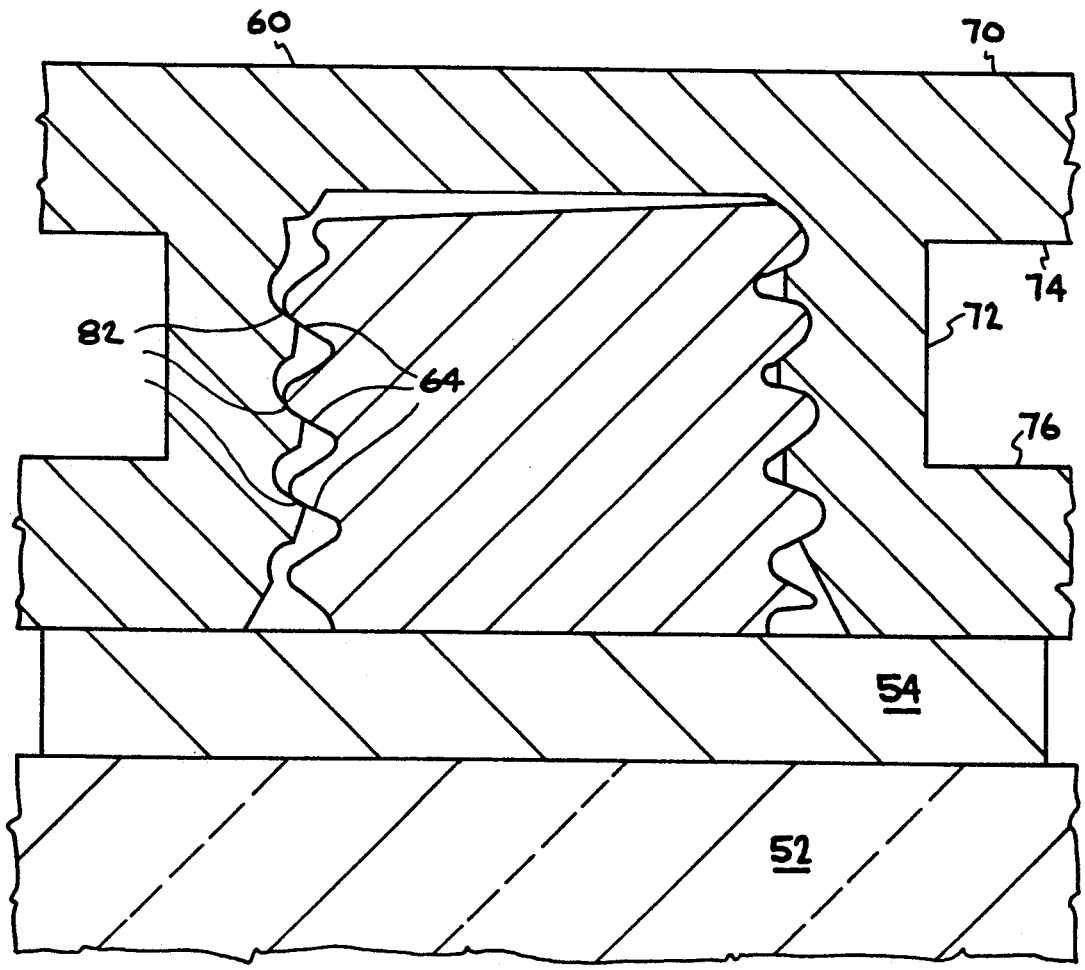
FIG. 5 is an enlarged cross-sectional view showing the internal threads of the aluminum heatsink engaging the external threads of the molybdenum stud according to the invention.

FIG. 5 shows a heatsink 70 assembled to a molybdenum stud 60. The flat lower surface 78 of the heatsink 70 is adapted to make contact with the top surface 56 of the slug 54. The core 72 of the heatsink 70 has a central bore 80 formed therein. The walls defining the bore have 10-32 internal threads 82 formed therein for receiving the external threads 64 of the stud 60. The softer internal threads 82 of the aluminum heatsink 70 engage the harder external threads 64 of the molybdenum stud 70.

Because the molybdenum material forming the external threads 64 of the stud 60 is considerably harder than the aluminum material forming the internal threads 82 of the heatsink 70, FIG. 5 indicates that the softer aluminum internal threads 82 of the heatsink 70 are deformed by the harder molybdenum external threads 64 of the stud 60 when the heatsink and the stud are assembled together. Deformation of the aluminum threads 82 is shown between the faces of the screw threads 82,64. This deformation of the aluminum threads 82 produces a very good mechanical and thermal bond between the stud 60 and the heatsink 70.

Because the aluminum and molybdenum have different coefficients of expansion, the mechanical and thermal bond therebetween is strengthened during temperature cycling and during thermal shock cycling due to further deformation of the aluminum threads. The temperature coefficients of expansion are similar for the molybdenum stud and the copper/tungsten slug, which minimizes the thermal stress at their interface during temperature cycling. Temperature cycling involves alternately subjecting units to ambient air temperatures between $-65$ degrees Centigrade and $+150$ degrees Centigrade for 1000 cycles. Thermal shock involves alternately immersing units in liquids at $-65$ degrees Centigrade and $+150$ degrees Centigrade for 100 cycles.

The thermal coefficients of expansion for various material are listed on page 37 of the *Microelectronics Packaging Handbook* edited by Rao Tummala et al., VAn Nostrand Reinhold Publishing Company, 1989. These thermal coefficients of expansion in units of $10^{-7}$ per degree Centigrade are: 230 for aluminum in the heatsink 70; 70 for copper/tungsten in the slug 54; 50 for molybdenum in the stud 60; and 66 for 96% alumina ceramic material in the package 52. Except for the aluminum heatsink material, these coefficients of expansion are similar. Note that in contrast, the coefficient of expansion of the copper in the prior art stud is $170 \times 10^{-7}$ per degree Centigrade.

By choosing molybdenum as a material for the stud 60, thermal stress induced by temperature and/or thermal shock cycling at the stud/slug interface is reduced in comparison to, for example, a copper stud. As a matter of fact, it has been found that temperature cycling and thermal shock and temperature cycling actually improve the mechanical bonding characteristics of the copper-tungsten/molybdenum interface. The mechanical bonding characteristics at the interface are tested by measuring the torque strength of the heatsink/package assembly. A measurement is taken of the amount of torque required to break the bond between the molybdenum stud 60 and the copper-tungsten slug 52. Data was taken on three groups of thirty sample units to measure the improved torque-strength performance of the aluminum/molybdenum interface. One group was a control group, which had not been subjected to either temperature cycling or to thermal-shock cycling. A second group was subject to temperature cycling. A third group was subject to thermal shock.

All of the units in each of the three groups were assembled with 15 in-lbs of torque. This was verified by observing the amount of disassembly or reverse torque required to unscrew a heatsink from a stud. This disassembly torque was measured on units which had not yet been subject to temperature cycling or to thermal-shock cycling. For the units subject to temperature cycling, the disassembly torque was measured to be an average of about 20 inch-lbs of torque.

The amount of torque required to break the bond between the stud 60 and the slug 54 was measured. The control group failed with a mean value of over torque of approximately 50 in-lbs. The temperature-cycling group failed with a mean value of reverse torque of approximately 95 in-lbs.—showing an improvement of approximately 90% over the control group. The thermal-shock cycling group failed with a mean value of reverse torque of approximately 74 in-lbs.—showing an improvement of approximately 50% over the control group.

In summary, the invention provides that the aluminum heatsink is secured to the molybdenum stud by the softer aluminum threads being deformed by the harder molybdenum threads. Use of molybdenum for the stud material also improves the bonding between the stud and the slug as the device is temperature cycled.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A cooling system for attachment of an external heatsink to an external mounting surface of a ceramic integrated-circuit package, comprising:
   a slug, or attachment plate, having a surface adapted for attachment to the external mounting surface of said ceramic integrated-circuit package;
   a molybdenum stud attached to and extending from said slug, said molybdenum stud having external threads formed thereupon, wherein the molybdenum material of the stud and the slug material have similar thermal coefficients of expansion, providing reduced thermal stress at the interface therebetween;
   an aluminum heatsink having a hole formed therein and with internal threads formed in the peripheral wall surrounding said hole for receiving the threaded molybdenum stud, wherein the external threads of said molybdenum stud engage and deform the threads formed in the softer aluminum heatsink to provide mechanical and thermal bonding between the harder material of the stud and the softer material of the heatsink.

2. The system of claim 1 wherein the slug is formed of copper/tungsten and is mounted to the external mounting surface of the ceramic integrated circuit with a silver/copper brazing material.

3. The system of claim 2 wherein the molybdenum stud is attached to said copper/tungsten slug with a silver/copper brazing material.

4. The system of claim 1 wherein the slug and the stud are formed of molybdenum.

5. An integrated circuit package assembly, comprising:
   a ceramic package having an external mounting surface for a heatsink;
   a copper/tungsten slug, or attachment plate, having a first surface attached to the mounting surface of said ceramic package with a silver/copper brazing material;
   a molybdenum stud attached to a second surface of said slug with a silver/copper brazing material and extending from said second surface of said copper/tungsten slug, said molybdenum stud having external threads formed thereupon wherein the molybdenum material of the stud and the copper/tungsten slug material have similar thermal coefficients of expansion, providing for reduced thermal stress at the interface therebetween;
   an aluminum heatsink having a hole formed therein and having internal threads formed in the peripheral wall surrounding said hole for receiving the threaded molybdenum stud, wherein the external threads of said harder molybdenum stud engage and deform the threads formed in the softer material of the aluminum heatsink to provide mechanical and thermal bonding between the stud and the heatsink.

* * * * *